United States Patent
Wang

(10) Patent No.: US 10,347,182 B2
(45) Date of Patent: Jul. 9, 2019

(54) OLED DISPLAY DEVICE

(71) Applicant: Shenzhen China Star Optoelectronics Semiconductor Display Technology Co., Ltd., Shenzhen (CN)

(72) Inventor: Zhenling Wang, Shenzhen (CN)

(73) Assignee: SHENZHEN CHINA STAR OPTOELECTRONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 23 days.

(21) Appl. No.: 15/744,074

(22) PCT Filed: Dec. 14, 2017

(86) PCT No.: PCT/CN2017/116286
§ 371 (c)(1),
(2) Date: Jan. 12, 2018

(87) PCT Pub. No.: WO2019/090896
PCT Pub. Date: May 16, 2019

(65) Prior Publication Data
US 2019/0139488 A1 May 9, 2019

(30) Foreign Application Priority Data
Nov. 7, 2017 (CN) .......................... 2017 1 1087315

(51) Int. Cl.
*G09G 3/32* (2016.01)
*G09G 3/3233* (2016.01)
(Continued)

(52) U.S. Cl.
CPC ......... *G09G 3/3233* (2013.01); *G09G 3/3266* (2013.01); *G09G 2300/0465* (2013.01);
(Continued)

(58) Field of Classification Search
CPC ............... G09G 3/3233; G09G 3/3266; G09G 2300/0465; G09G 2300/0819;
(Continued)

(56) References Cited

U.S. PATENT DOCUMENTS

2006/0255994 A1    11/2006  Lin
2013/0147694 A1*   6/2013   Kim .................. G09G 3/32
                                                  345/82
2016/0098961 A1*   4/2016   Han ................. G09G 3/3291
                                                  345/691

FOREIGN PATENT DOCUMENTS

CN    102637701 A    8/2012
CN    105489159 A    4/2016
CN    106652911 A    5/2017

* cited by examiner

*Primary Examiner* — Lisa S Landis
(74) *Attorney, Agent, or Firm* — Leong C. Lei

(57) ABSTRACT

The invention provides an OLED display device, using a 3T1C driving structure, and having the source of the first TFT to the reference voltage to ensure the second TFT to operate in saturation region in normal display state through controlling the reference voltage, to ensure the grayscale continuity. By using a reference voltage metal layer to cover all sub-pixels to replace reference voltage routing to provide reference voltage to the source of the first TFT, the invention eliminates the impact of reference voltage routing on pixel aperture ration.

16 Claims, 5 Drawing Sheets

(51) Int. Cl.
*G09G 3/3266* (2016.01)
*H01L 27/32* (2006.01)
(52) U.S. Cl.
CPC ............ *G09G 2300/0819* (2013.01); *G09G 2310/027* (2013.01); *G09G 2320/0233* (2013.01); *H01L 27/3262* (2013.01)
(58) Field of Classification Search
CPC ...... G09G 2310/027; G09G 2320/0233; H01L 27/3262
See application file for complete search history.

OLED DISPLAY DEVICE

BACKGROUND OF THE INVENTION

1. Field of the Invention

The present invention relates to the field of power supply techniques, and in particular to a power supply device and current equalization method thereof.

2. The Related Arts

The organic light emitting diode (OLED) provides the advantages of active-luminescent, low driving voltage, high emission efficiency, quick response time, high resolution and contrast, near 180° viewing angle, wide operation temperature range, and capability to realize flexible display and large-area full-color display, and is heralded as the most promising display technology.

The OLED is an electroluminescent device driven by electric current; that is, when a current flows through OLED, the OLED illuminates, and the brightness is determined by the current flowing through the OLED. The majority of known integrated circuit (IC) only transmits the voltage signal, and the pixel driving circuit of the OLED display must accomplish the task of translating the voltage signal into a current signal. The conventional pixel driving circuit usually uses a 2T1C structure, i.e., two thin film transistors (TFT) and a capacitor, to translate the voltage into current.

Because of the non-uniformity of the TFT fabrication process, the threshold voltages of the driving TFTs of all pixels in the OLED display device will be inconsistent. Moreover, due to long operation time, the ageing of the driving TFT will cause voltage drift of the threshold voltage of the driving TFTs, leading to display unevenness. Hence, the OLED pixel driving circuit usually must be disposed with compensation function to compensate the threshold voltage drift.

As shown in FIG. 1, a conventional OLED pixel driving circuit comprises a first TFT T1', a second TFT T2', a third TFT T3', a capacitor C1', an OLED D1', a switch K', a digital-to-analog converter (DAC) DAC', and a analog-to-digital converter (ADC) ADC'. The second TFT T2' is a driving TFT that directly drives the OLED D1'. The switch K' is controlled by a switch signal Switch', and comprises a first pin a second pin K2', and a third pin K3'. The first TFT T1' has a gate connected to a scan signal Scan', a drain connected to the power supply voltage OVDD', and a source electrically connected to a gate of the second TFT T2' and one end of the capacitor C1'. The second TFT T2' has a drain connected to the power supply voltage OVDD', a source electrically connected to an anode of the OLED D1'; the OLED D1' has a cathode o connected to a common ground voltage OVSS'; the capacitor C1' has the other end electrically connected to the source of the second TFT T2'; the third TFT T3' has a gate connected to a sensing control signal Sense', a source connected to the source of the second TFT T2', and a drain electrically connected to the first pin K1' of the switch K'; the switch K' has the second pin K2' electrically connected to the DAC' and the third pin K3' electrically connected to the ADC'. When the circuit is charging the capacitor C1', to ensure that the OLED D1' does not emit light, the threshold voltage of the OLED D1' needs to be limited to about 10V. The tri-layer device needs to be fabricated in the OLED device, which limits the number of layers of the OLED device. When the OLED D1' emits light, the difference between the gate-source voltage of the second TFT T2' and the threshold voltage is greater than that of the source-drain voltage so that the second TFT T2' operates in the linear region, indicating the grayscale is not continuous and the voltage drop (IR drop) of the power supply voltage OVDD' flowing through the OLED device D1' is seriously affected.

SUMMARY OF THE INVENTION

The object of the present invention is to provide an OLED display device, not only able to compensate to eliminate the impact of the threshold voltage of the driving TFT on the current flowing through the OLED, but also able to make the driving TFT operating in the saturation region during normal displaying to ensure the grayscale continuous and not affecting the aperture ratio of the pixel.

To achieve the above object, the present invention provides an OLED display device, which comprises: a display panel, and a driving chip electrically connected to the display panel; the display panel comprising: a plurality of sub-pixels arranged in an array; the driving chip being disposed with a switch, a digital-to-analog converter (DAC), an analog-to-digital converter (ADC), and a reference voltage driving module;

the switch being controlled by a switch signal, and comprising: a first pin, a second pin, and a third pin; each sub-pixel comprising: a first thin film transistor (TFT), a second TFT, a third TFT, a capacitor, and an OLED;

the first TFT having a gate receiving a scan signal, a source receiving a reference voltage, and a drain electrically connected to a gate of the second TFT; the second TFT having a drain receiving a power supply voltage, and a source electrically connected to an anode of the OLED; the OLED having a cathode receiving a common ground voltage; the capacitor having two ends electrically connected to the anode of the OLED and the drain of the first TFT respectively; the third TFT having a gate receiving a sensing control signal, a source electrically connected to the first pin of the switch, and a drain electrically connected to the source of the second TFT; the switch having the second pin electrically connected to the DAC, and the third pin electrically connected to the ADC;

the source of the first TFT receiving the reference voltage from the reference voltage driving module through a reference voltage metal layer covering all sub-pixels.

According to a preferred embodiment of the present invention, when the OLED display device is in normal display state, the switch signal controls the switch to connect the first pin to the second pin, and the DAC provides a second data signal to the source of the second TFT.

According to a preferred embodiment of the present invention, when the OLED display device is in normal display state, the scan signal first provides a high voltage, and then switches to a low voltage; the sensing control signal first provides a high voltage synchronous with the high voltage of the scan signal, and then switches to a low voltage; the common ground voltage is always at low voltage.

According to a preferred embodiment of the present invention, when the OLED display device is in normal display state, the gate of the second TFT has a voltage always less than the power supply voltage.

According to a preferred embodiment of the present invention, when the OLED display device performs threshold voltage detection, the switch signal controls the switch to first connect the first pin to the second pin, and then connect the first pin to the third pin; when the switch connects the first pin to the second pin, the DAC provides a data signal to the source of the second TFT; when the switch connects the first pin to the third pin, the ADC senses the threshold voltage of the second TFT.

According to a preferred embodiment of the present invention, when the OLED display device performs threshold voltage detection, the scan signal providing a high voltage when the switch connects the first pin to the second pin, and switches to the a low voltage when the switch connects the first pin to the third pin;

the sensing control signal provides a high voltage when the switch connects the first pin to the second pin, and stays at the high voltage when the switch connects the first pin to the third pin, and then switches to a low voltage;

the common ground voltage is always at high voltage and the OLED is always cut off.

According to a preferred embodiment of the present invention, when the OLED display device is in normal display state, the reference voltage is at a first voltage level; when the OLED display device performs threshold voltage detection, the reference voltage is at a second voltage level; the second voltage level is smaller than the first voltage level.

According to a preferred embodiment of the present invention, the gates of the first TFT, second TFT, and third TFT are located at a first metal layer; the sources and drains of the first TFT, second TFT, and third TFT are located at a second metal layer;

the first metal layer, the second metal layer, and the reference voltage metal layer are stacked in series, a first insulating layer is disposed between the first metal layer and the second metal layer, and a second insulating layer is disposed between the second metal layer and the reference voltage metal layer.

According to a preferred embodiment of the present invention, the reference voltage metal layer is electrically connected to the drain of the first TFT located at the second metal layer through a via disposed in the second insulating layer.

According to a preferred embodiment of the present invention, the reference voltage metal layer is electrically connected to the reference voltage driving module of the driving chip through a bypass pin of a flip-chip thin film packaging the driving chip.

The present invention also provides an OLED display device, which comprises: a display panel, and a driving chip electrically connected to the display panel; the display panel comprising: a plurality of sub-pixels arranged in an array; the driving chip being disposed with a switch, a digital-to-analog converter (DAC), an analog-to-digital converter (ADC), and a reference voltage driving module;

the switch being controlled by a switch signal, and comprising: a first pin, a second pin, and a third pin; each sub-pixel comprising: a first thin film transistor (TFT), a second TFT, a third TFT, a capacitor, and an OLED;

the first TFT having a gate receiving a scan signal, a source receiving a reference voltage, and a drain electrically connected to a gate of the second TFT; the second TFT having a drain receiving a power supply voltage, and a source electrically connected to an anode of the OLED; the OLED having a cathode receiving a common ground voltage; the capacitor having two ends electrically connected to the anode of the OLED and the drain of the first TFT respectively; the third TFT having a gate receiving a sensing control signal, a source electrically connected to the first pin of the switch, and a drain electrically connected to the source of the second TFT; the switch having the second pin electrically connected to the DAC, and the third pin electrically connected to the ADC;

the source of the first TFT receiving the reference voltage from the reference voltage driving module through a reference voltage metal layer covering all sub-pixels.

wherein when the OLED display being in normal display state, the switch signal controlling the switch to connect the first pin to the second pin, and the DAC providing a second data signal to the source of the second TFT;

wherein when the OLED display being in normal display state, the scan signal first providing a high voltage, and then switching to a low voltage; the sensing control signal first providing a high voltage synchronous with the high voltage of the scan signal, and then switching to a low voltage; the common ground voltage staying always at low voltage;

wherein when the OLED display device being in normal display state, the gate of the second TFT having a voltage always less than the power supply voltage;

wherein when the OLED display device performing threshold voltage detection, the switch signal controlling the switch to first connect the first pin to the second pin, and then connect the first pin to the third pin; when the switch connecting the first pin to the second pin, the DAC providing a data signal to the source of the second TFT; when the switch connecting the first pin to the third pin, the ADC sensing the threshold voltage of the second TFT.

The present invention provides the following advantages: the invention provides an OLED display device, using a 3T1C driving structure, and disposing a switch in the driving chip. The switch has a first pin connected to the drain of the third TFT, a second pin connected to the DAC, and a third pin connected to the ADC. By switch signal to control the switch to connect the first pin to the second pin to output data signal, and by switch signal to control the switch to connect the first pin to the third pin to sense threshold voltage of the driving TFT, the invention can eliminate the impact of the threshold voltage of driving TFT on the current flowing through the OLED, improve display evenness. By connecting the source of the first TFT to the reference voltage, the invention can make the driving TFT to operate in saturation region in normal display state through controlling the reference voltage, to ensure the grayscale continuity. By using a reference voltage metal layer to cover all sub-pixels to replace reference voltage routing to provide reference voltage to the source of the first TFT, the invention eliminates the impact of reference voltage routing on pixel aperture ration.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention and for those having ordinary skills in the art, other drawings may be easily obtained from these drawings without paying any creative effort. In the drawings.

DETAILED DESCRIPTION OF THE PREFERRED EMBODIMENTS

Figure 1:
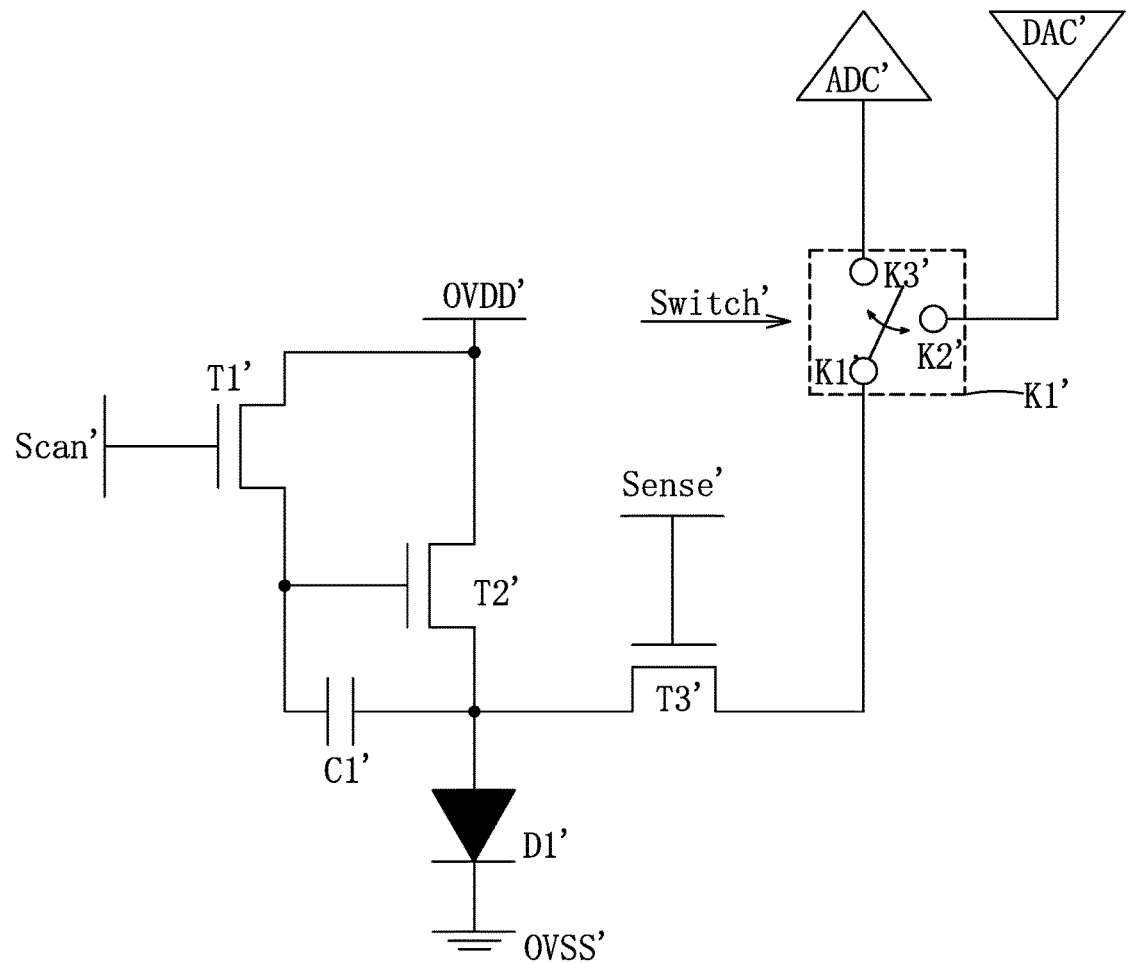
FIG. 1 is a schematic view showing a pixel driving circuit of a known OLED.
Figure 2:
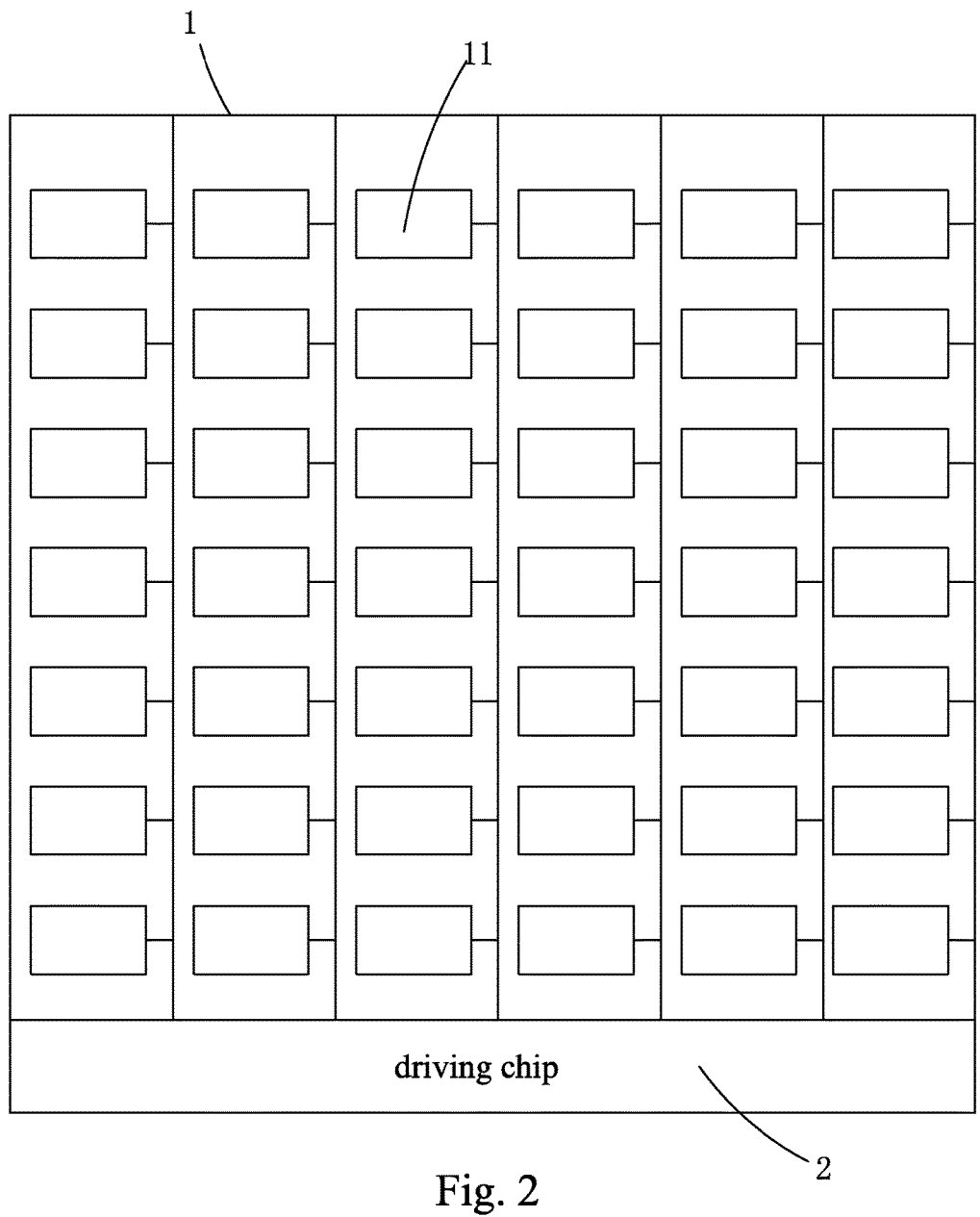
FIG. 2 is a schematic view showing the structure of an OLED display device according to the present invention.
Figure 3:
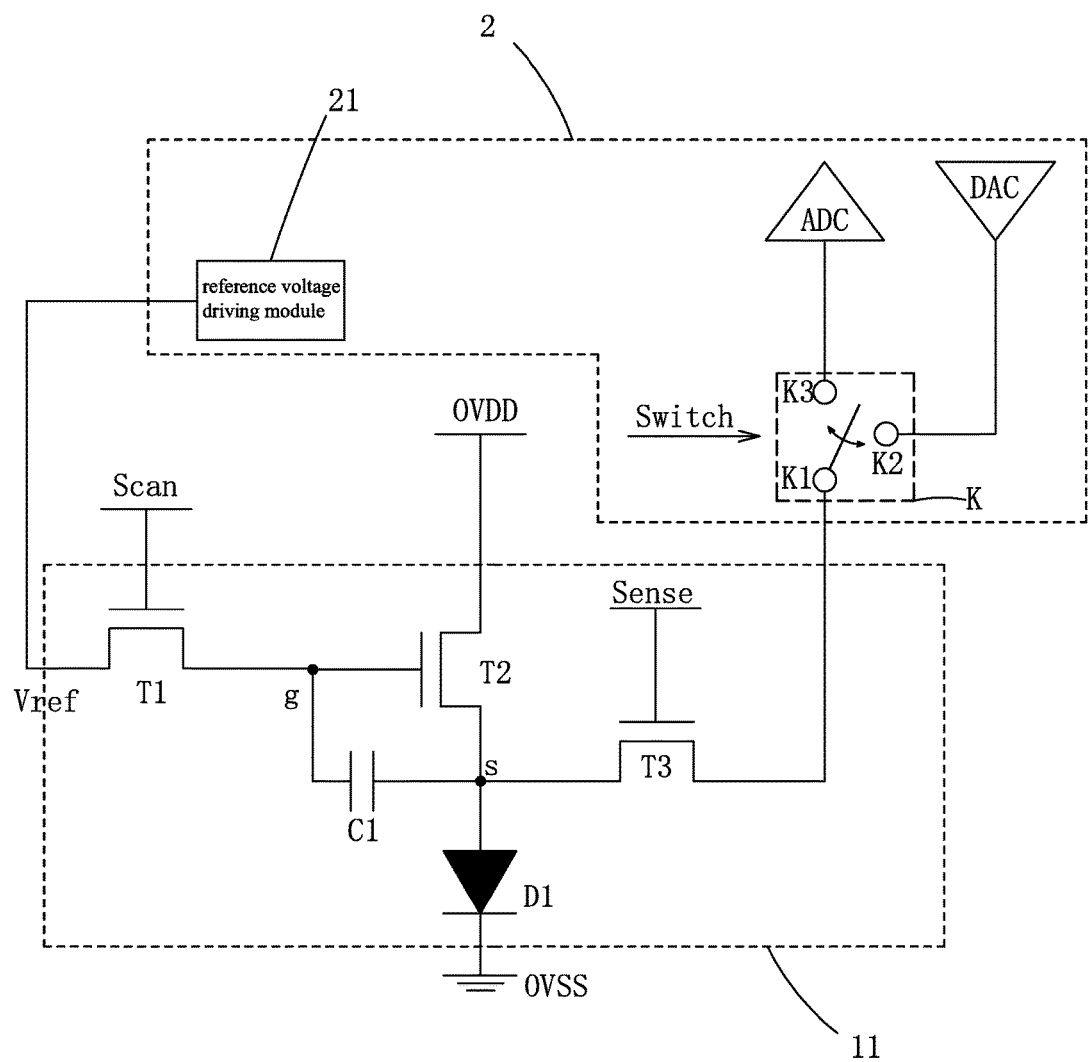
FIG. 3 is a schematic view showing an equivalent circuit of the connection between each sub-pixel and riving chip of an OLED display device according to the present invention.

Referring to FIG. 2 and FIG. 3, the present invention provides an OLED, which comprises: a display panel 1, and a driving chip 2 electrically connected to the display panel 1; the display panel 1 comprising: a plurality of sub-pixels 11 arranged in an array; the driving chip 2 being disposed with a switch K, a digital-to-analog converter (DAC) DAC, an analog-to-digital converter (ADC) ADC, and a reference voltage driving module 21; the switch K being controlled by a switch signal Switch, and comprising: a first pin K1, a second pin K2, and a third pin K3; each sub-pixel 11 comprising: a first thin film transistor (TFT) T1, a second TFT t2, a third TFT T3, a capacitor C1, and an OLED D1.

The first TFT T1 has a gate receiving a scan signal Scan, a source receiving a reference voltage Vref, and a drain electrically connected to a gate of the second TFT T2; the second TFT T2 has a drain receiving a power supply voltage OVDD, and a source electrically connected to an anode of the OLED D1; the OLED D1 has a cathode receiving a common ground voltage OVSS; the capacitor C1 has two ends electrically connected to the anode of the OLED D1 and the drain of the first TFT T1 respectively; the third TFT T3 has a gate receiving a sensing control signal Sense, a source electrically connected to the first pin K1 of the switch K, and a drain electrically connected to the source of the second TFT T2; the switch K has the second pin K2 electrically connected to the digital-to-analog converter DAC, and the third pin K3 electrically connected to the analog-to-digital converter ADC.

Specifically, to prevent the reference voltage routing from affecting the pixel aperture ratio while accessing the reference voltage Vref, in the present invention, a reference voltage metal layer M3 covering all the sub-pixels 11 is added to replace the conventional reference voltage routing to provide the reference voltage Vref to the source of the first TFT T1. That is, the source of the first TFT T1 is electrically connected to the reference voltage driving module 21 through the reference voltage metal layer M3 covering all the sub-pixels 11 to obtain the reference voltage Vref.

Figure 4:
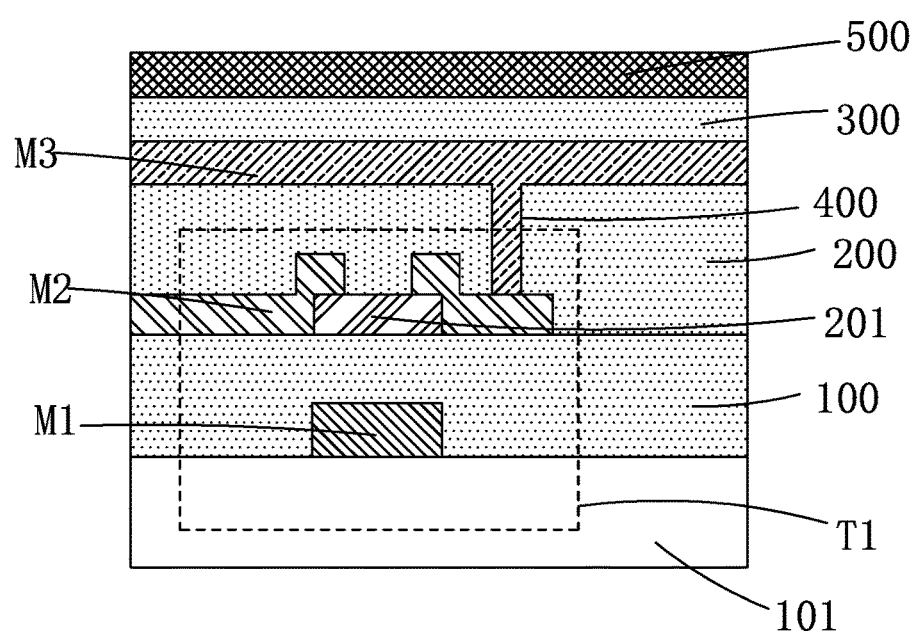
FIG. 4 is a cross-sectional view showing the OLED display device at the first TFT according to the present invention.

In actual practice, as shown in FIG. 4, the detailed structure of the display panel comprises: a base substrate 101, a first metal layer M1 disposed on the base substrate 101, a first insulating layer 100 covering the first metal layer M1 and the base substrate 101, a semiconductor layer 201 and a second metal layer M2, both disposed on the first insulating layer 100, a second insulating layer 200 covering the semiconductor layer 201, the second metal layer M2, and the first insulating layer 100, the reference voltage metal layer M3 covering the second insulating layer 200, a third insulating layer 300 covering the reference voltage metal layer M3, and an OLED layer 500 disposed on the third insulating layer 300; wherein the gates of the first TFT T1, second TFT T2, and third TFT T3 are located at the first metal layer M1; the sources and drains of the first TFT T1, second TFT T2, and third TFT T3 are located at the second metal layer M2; the reference voltage metal layer M3 is electrically connected to the drain of the first TFT T1 located at the second metal layer M2 through a via 400 disposed in the second insulating layer 200.

It should be noted that, to avoid increasing the manufacturing cost of the driving chip 2, in the present invention, the reference voltage metal layer M3 is electrically connected to the reference voltage driving module 21 of the driving chip 2 through a bypass pin of a flip-chip thin film packaging the driving chip 2.

Specifically, the above display panel 1 can be manufactured by the following method: a first metal film is deposited on the base substrate 101, and patternized to obtained the first metal layer M1 having the gates of the first TFT T1, second TFT T2, and third TFT T3; then, the first insulating layer 100 and a semiconductor thin film are deposited in sequence on the first metal layer M1 and the base substrate 101, the semiconductor thin film is patternized to obtain the semiconductor layer 201; then, a second metal thin film is deposited on the semiconductor layer 201 and the first insulating layer 100, patternized to obtain the second metal layer M2 having the sources and drains of the first TFT T1, second TFT T2, and third TFT T3; then, the second insulating layer 200 is deposited on the second metal layer M2, the semiconductor layer 201, and the first insulating layer 101, patternized to obtain the via 400 penetrating the second insulating layer 200 to expose the drain of the first TFT T1; then, a third metal thin film is deposited on the second insulating layer 200, patternized to obtain the reference voltage metal layer M3 with a first connecting via penetrating the reference voltage metal layer M3 at location corresponding to the source of the second TFT T2; then, the third insulating layer 300 is deposited on the reference voltage metal layer M3, patternized to obtain a plurality of second connecting vias, which penetrates the source of the second TFT exposed by the first connecting via; and finally, an OLED layer 500 is deposited on the third insulating layer 300, the anode of the OLED D1 of the OLED layer 500 is connected to the source of the second TFT T2 through the second connecting vias; as the second connecting vias is smaller than the first connecting via in diameter, the third insulating layer 300 insulates the anode of the OLED d1 from the reference voltage metal layer M3.

Figure 5:
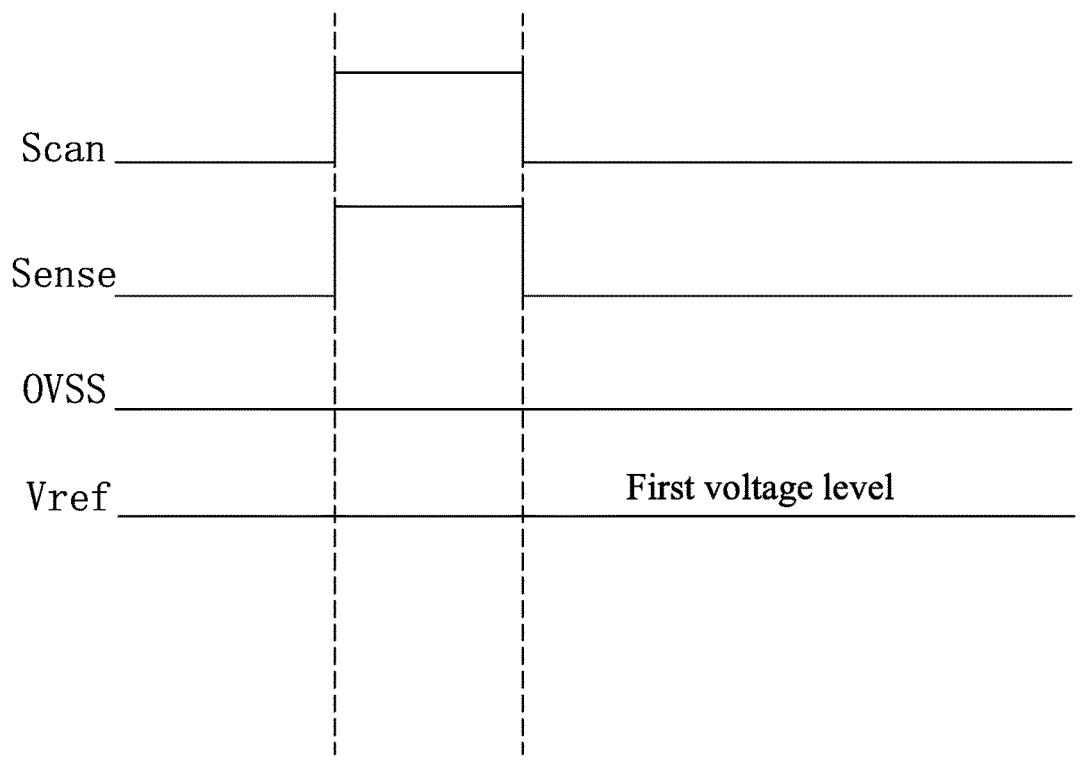
FIG. 5 is a schematic view showing the waveform of the OLED display device in a normal display state according to the present invention.
Figure 6:
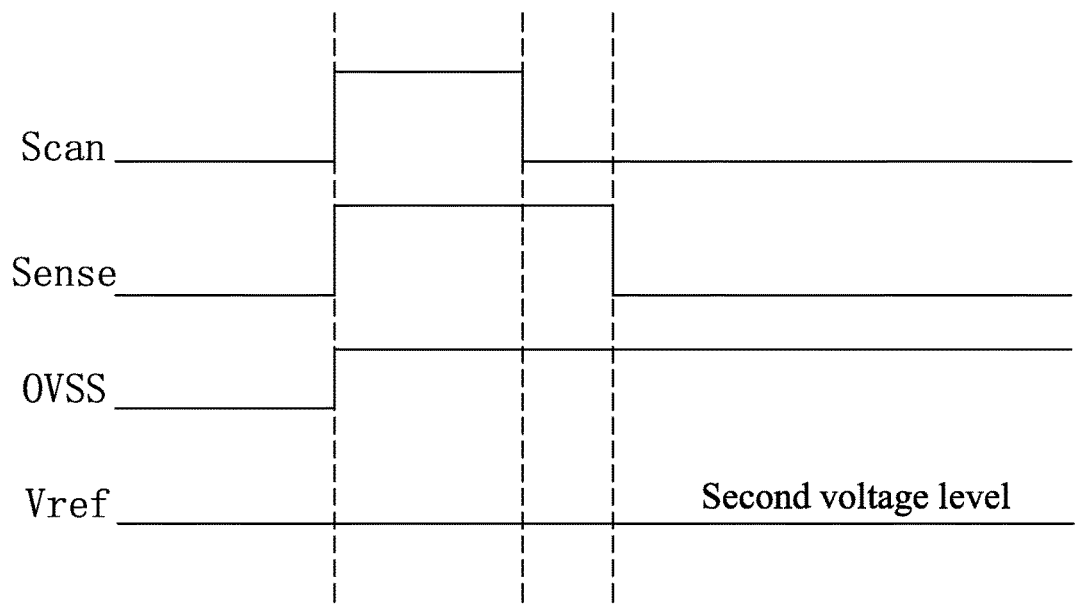
FIG. 6 is a schematic view showing the waveform of the OLED display device performing threshold voltage detection according to the present invention.

Moreover, refer to FIG. 5 and FIG. 6, showing two operation states of the OLED display device of the present invention in normal display and threshold voltage detection.

Refer to FIG. 5. In normal display, the switch signal Switch controls the switch K to connect the first pin K1 to the second pin K2, and the digital-to-analog converter DAC provides a second data signal Data to the source of the second TFT T2. Both the scan signal Scan and the sensing control signal Sense first provide a high voltage so that the first TFT T1 and the third TFT T3 are both turned on. In this stage, the reference voltage Vref enters the gate g of the second TFT T2 through the conductive first TFT T1, i.e., Vg=Vref (Vg is the voltage level at the gate g of the second TFT T2); the data signal Data is written into the source s of the second TFT T2 through the first pin K1 and second pin K2 of the switch K and the conductive third TFT t3, i.e., Vs=$V_{Data}$, (Vs is the voltage level at the source s of the second TFT T2, $V_{Data}$ is the voltage level of the data signal Data). Then, Both the scan signal Scan and the sensing control signal Sense switch to a low voltage so that the first TFT T1 and the third TFT T3 are both cut off, the second TFT is turned on, and the OLED d1 starts to emit light. At this time, the Vg and Vs start to rise, and the difference between Vg and Vs stays unchanged due to the effect of the capacitor C1. At this point, the Vg=Vref+ΔV (ΔV is the increased voltage amount of Vg after the first TFT T1 and third TFT T3 cut off), and Vs=$V_{Data}$+ΔV, Vd=OVDD (Vd is the voltage level at the drain d of the second TFT T2). As such, by setting the voltage level of the reference voltage, the Vg is always less than Vd in this phase, i.e., when the OLED display device is in normal display state, the gate voltage of the second TFT T2 is always lower than the power supply voltage OVDD, so as to ensure that the second TFT T2 always operates in the saturation region to guarantee the grayscale continuity. For example, in an embodiment of the present invention, ΔV is 9V, OVDD is 24V, and the Vref is set to be less than 15V to ensure the gate voltage of the second TFT T2 is always lower than the power supply voltage OVDD when the OLED display device is in normal display state.

Refer to FIG. 6. When the OLED display device performs threshold voltage detection, the switch signal Switch first keeps the switch K to connect the first pin K1 to the second pin K2, and both the scan signal Scan and the sensing control signal Sense first provide a high voltage pulse to turn on the first TFT T1 and third TFT T3. The reference voltage Vref enters the gate g of the second TFT T2 through the first TFT T1, i.e., Vg=Vref. The DAC DAC writes the data signal Data to the source s of the second TFT T2 through the first pin K1 and second pin K2 of the switch K and the conductive third TFT T3. The common ground voltage OVSS provides a high voltage and the data signal Data has a voltage level smaller than the threshold voltage of the OLED D1 to ensure that the OLED D1 will not emit. Immediately, the switch signal Switch controls the switch K to connect the first pin K1 to the third pin K3, the scan signal Scan switches to a low voltage and the sensing control signal stays at the high voltage so that the first TFT T1 is cut off and the third TFT T3 and second TFT T2 are both conductive. The current flowing through the second TFT T2 charges the storage capacitor C1 so that the source voltage of the second TFT T2 rises to Vref−Vth (Vth is the threshold voltage of the second TFT T2). The ADC ADC can sense the threshold voltage Vth of the second TFT T2 (the driving TFT) through the conductive third TFT T3 and the first pin K1 and third pin K3 of the switch K. After this, both the scan signal Scan and the sensing control signal Sense stay at low voltage.

At the same time, to ensure that the OLED d1 does not emit when the source voltage of the second TFT T2 is raised to Vref−Vth, the present invention further configures the reference voltage Vref to have two voltages levels; wherein, when the OLED display device is in normal display state, the reference voltage Vref is at a first voltage level level; when the OLED display device performs threshold voltage detection, the reference voltage Vref is at a second voltage level level; the second voltage level level is less than the first voltage level level. By setting a lower reference voltage when the OLED display device performs threshold voltage detection, the present invention can prevent the OLED D1 to emit light when the OLED display device performs threshold voltage detection to ensure the accuracy of the threshold voltage detection of the second TFT t2.

In summary, the invention provides an OLED display device, using a 3T1C driving structure, and disposing a switch in the driving chip. The switch has a first pin connected to the drain of the third TFT, a second pin connected to the DAC, and a third pin connected to the ADC. By switch signal to control the switch to connect the first pin to the second pin to output data signal, and by switch signal to control the switch to connect the first pin to the third pin to sense threshold voltage of the driving TFT, the invention can eliminate the impact of the threshold voltage of driving TFT on the current flowing through the OLED, improve display evenness. By connecting the source of the first TFT to the reference voltage, the invention can make the driving TFT to operate in saturation region in normal display state through controlling the reference voltage, to ensure the grayscale continuity. By using a reference voltage metal layer to cover all sub-pixels to replace reference voltage routing to provide reference voltage to the source of the first TFT, the invention eliminates the impact of reference voltage routing on pixel aperture ration.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic light-emitting diode (OLED) display device, which comprises: a display panel, and a driving chip electrically connected to the display panel; the display panel comprising: a plurality of sub-pixels arranged in an array; the driving chip being disposed with a switch, a digital-to-analog converter (DAC), an analog-to-digital converter (ADC), and a reference voltage driving module;

the switch being controlled by a switch signal, and comprising: a first pin, a second pin, and a third pin; each sub-pixel comprising: a first thin film transistor (TFT), a second TFT, a third TFT, a capacitor, and an OLED;

the first TFT having a gate receiving a scan signal, a source receiving a reference voltage, and a drain electrically connected to a gate of the second TFT; the second TFT having a drain receiving a power supply voltage, and a source electrically connected to an anode of the OLED; the OLED having a cathode receiving a common ground voltage; the capacitor having two ends electrically connected to the anode of the OLED and the drain of the first TFT respectively; the third TFT having a gate receiving a sensing control signal, a source electrically connected to the first pin of the switch, and a drain electrically connected to the source of the second TFT; the switch having the second pin electrically connected to the DAC, and the third pin electrically connected to the ADC;

the source of the first TFT receiving the reference voltage from the reference voltage driving module through a reference voltage metal.

2. The OLED display device as claimed in claim 1, wherein when the OLED display device is in normal display state, the switch signal controls the switch to connect the first pin to the second pin, and the DAC provides a second data signal to the source of the second TFT.

3. The OLED display device as claimed in claim 2, wherein when the OLED display device is in normal display state, the scan signal first provides a high voltage, and then switches to a low voltage; the sensing control signal first provides a high voltage synchronous with the high voltage of the scan signal, and then switches to a low voltage; the common ground voltage is always at low voltage.

4. The OLED display device as claimed in claim 1, wherein when the OLED display device is in normal display state, the gate of the second TFT has a voltage always less than the power supply voltage.

5. The OLED display device as claimed in claim 1, wherein when the OLED display device performs threshold voltage detection,
the switch signal controls the switch to first connect the first pin to the second pin, and then connect the first pin to the third pin; when the switch connects the first pin to the second pin, the DAC provides a data signal to the source of the second TFT; when the switch connects the first pin to the third pin, the ADC senses the threshold voltage of the second TFT.

6. The OLED display device as claimed in claim 5, wherein when the OLED display device performs threshold voltage detection,
the scan signal providing a high voltage when the switch connects the first pin to the second pin, and switches to the a low voltage when the switch connects the first pin to the third pin;
the sensing control signal provides a high voltage when the switch connects the first pin to the second pin, and stays at the high voltage when the switch connects the first pin to the third pin, and then switches to a low voltage;
the common ground voltage is always at high voltage and the OLED is always cut off.

7. The OLED display device as claimed in claim 1, wherein when the OLED display device is in normal display state, the reference voltage is at a first voltage level; when the OLED display device performs threshold voltage detection, the reference voltage is at a second voltage level; the second voltage level is smaller than the first voltage level.

8. The OLED display device as claimed in claim 1, wherein the gates of the first TFT, second TFT, and third TFT are located at a first metal layer; the sources and drains of the first TFT, second TFT, and third TFT are located at a second metal layer;
the first metal layer, the second metal layer, and the reference voltage metal layer are stacked in series, a first insulating layer is disposed between the first metal layer and the second metal layer, and a second insulating layer is disposed between the second metal layer and the reference voltage metal layer.

9. The OLED display device as claimed in claim 8, wherein the reference voltage metal layer is electrically connected to the drain of the first TFT located at the second metal layer through a via disposed in the second insulating layer.

10. The OLED display device as claimed in claim 8, wherein the reference voltage metal layer is electrically connected to the reference voltage driving module of the driving chip through a bypass pin of a flip-chip thin film packaging the driving chip.

11. An organic light-emitting diode (OLED) display device, which comprises: a display panel, and a driving chip electrically connected to the display panel; the display panel comprising: a plurality of sub-pixels arranged in an array; the driving chip being disposed with a switch, a digital-to-analog converter (DAC), an analog-to-digital converter (ADC), and a reference voltage driving module;
the switch being controlled by a switch signal, and comprising: a first pin, a second pin, and a third pin; each sub-pixel comprising: a first thin film transistor (TFT), a second TFT, a third TFT, a capacitor, and an OLED;
the first TFT having a gate receiving a scan signal, a source receiving a reference voltage, and a drain electrically connected to a gate of the second TFT; the second TFT having a drain receiving a power supply voltage, and a source electrically connected to an anode of the OLED; the OLED having a cathode receiving a common ground voltage; the capacitor having two ends electrically connected to the anode of the OLED and the drain of the first TFT respectively; the third TFT having a gate receiving a sensing control signal, a source electrically connected to the first pin of the switch, and a drain electrically connected to the source of the second TFT; the switch having the second pin electrically connected to the DAC, and the third pin electrically connected to the ADC;
the source of the first TFT receiving the reference voltage from the reference voltage driving module through a reference voltage metal;
wherein when the OLED display device being in normal display state, the switch signal controlling the switch to connect the first pin to the second pin, and the DAC providing a second data signal to the source of the second TFT;
wherein when the OLED display device being in normal display state, the scan signal first providing a high voltage, and then switching to a low voltage; the sensing control signal first providing a high voltage synchronous with the high voltage of the scan signal, and then switching to a low voltage; the common ground voltage being always at low voltage;
wherein when the OLED display device being in normal display state, the gate of the second TFT having a voltage always less than the power supply voltage;
wherein when the OLED display device performing threshold voltage detection,
the switch signal controlling the switch to first connect the first pin to the second pin, and then connect the first pin to the third pin; when the switch connecting the first pin to the second pin, the DAC providing a data signal to the source of the second TFT; when the switch connecting the first pin to the third pin, the ADC sensings the threshold voltage of the second TFT.

12. The OLED display device as claimed in claim 11, wherein when the OLED display device performs threshold voltage detection,
the scan signal providing a high voltage when the switch connects the first pin to the second pin, and switches to the a low voltage when the switch connects the first pin to the third pin;
the sensing control signal provides a high voltage when the switch connects the first pin to the second pin, and stays at the high voltage when the switch connects the first pin to the third pin, and then switches to a low voltage;
the common ground voltage is always at high voltage and the OLED is always cut off.

13. The OLED display device as claimed in claim 11, wherein when the OLED display device is in normal display state, the reference voltage is at a first voltage level; when the OLED display device performs threshold voltage detection, the reference voltage is at a second voltage level; the second voltage level is smaller than the first voltage level.

14. The OLED display device as claimed in claim 11, wherein the gates of the first TFT, second TFT, and third TFT are located at a first metal layer; the sources and drains of the first TFT, second TFT, and third TFT are located at a second metal layer;

the first metal layer, the second metal layer, and the reference voltage metal layer are stacked in series, a first insulating layer is disposed between the first metal layer and the second metal layer, and a second insulating layer is disposed between the second metal layer and the reference voltage metal layer.

15. The OLED display device as claimed in claim 14, wherein the reference voltage metal layer is electrically connected to the drain of the first TFT located at the second metal layer through a via disposed in the second insulating layer.

16. The OLED display device as claimed in claim 14, wherein the reference voltage metal layer is electrically connected to the reference voltage driving module of the driving chip through a bypass pin of a flip-chip thin film packaging the driving chip.

* * * * *